(12) United States Patent
Lu et al.

(10) Patent No.: US 7,378,455 B2
(45) Date of Patent: *May 27, 2008

(54) MOLDING COMPOSITION AND METHOD, AND MOLDED ARTICLE

(75) Inventors: Qiwei Lu, Schenectady, NY (US); Michael O'Brien, Clifton Park, NY (US); Michael Vallance, Loudonville, NY (US)

(73) Assignee: General Electric Company, Schenectady, NY (US)

( * ) Notice: Subject to any disclaimer, the term of this patent is extended or adjusted under 35 U.S.C. 154(b) by 345 days.

This patent is subject to a terminal disclaimer.

(21) Appl. No.: 11/172,308

(22) Filed: Jun. 30, 2005

(65) Prior Publication Data

US 2007/0004819 A1  Jan. 4, 2007

(51) Int. Cl.
C08F 2/50 (2006.01)
B29C 41/00 (2006.01)
B29C 39/00 (2006.01)

(52) U.S. Cl. .......................... 522/100; 522/25; 522/28; 522/30; 522/31; 522/66; 522/71; 522/74; 522/77; 522/79; 522/81; 522/83; 522/168; 522/170; 522/178; 522/181; 525/396; 525/340; 428/413; 427/493; 264/272.13; 264/272.17; 264/331.12; 264/331.14; 264/272.11

(58) Field of Classification Search .................. 522/25, 522/28, 30, 31, 66, 71, 74, 77, 79, 81, 83, 522/168, 170, 178, 181; 525/396, 340; 428/413; 427/493; 528/416, 355, 922; 264/272.13, 272.17, 331.12, 331.14, 272.11
See application file for complete search history.

(56) References Cited

U.S. PATENT DOCUMENTS

| | | |
|---|---|---|
| 3,306,874 A | 2/1967 | Hay |
| 3,306,875 A | 2/1967 | Hay |
| 3,375,228 A | 3/1968 | Holoch et al. |
| 3,496,236 A | 2/1970 | Cooper et al. |
| 4,140,675 A | 2/1979 | White |
| 4,165,422 A | 8/1979 | White |
| 4,234,706 A | 11/1980 | White |
| 4,329,306 A | 5/1982 | Crivello |
| 4,521,584 A | 6/1985 | Heitz et al. |
| 4,562,243 A | 12/1985 | Percec |
| 4,593,052 A * | 6/1986 | Irving ..................... 522/31 |
| 4,623,558 A | 11/1986 | Lin |
| 4,634,742 A | 1/1987 | Percec |
| 4,663,402 A | 5/1987 | Perced et al. |
| 4,665,137 A | 5/1987 | Percec |
| 4,677,185 A | 6/1987 | Heitz et al. |
| 4,701,514 A | 10/1987 | Percec |
| H521 H | 9/1988 | Fan |
| 4,806,601 A | 2/1989 | Percec |
| 4,842,800 A * | 6/1989 | Walles et al. ........... 264/272.13 |
| 4,845,159 A | 7/1989 | Chao |
| 4,882,201 A | 11/1989 | Crivello et al. |
| 4,912,171 A * | 3/1990 | Grootaert et al. ........... 525/340 |
| 4,912,172 A | 3/1990 | Hallgren et al. |
| 4,920,164 A | 4/1990 | Sasaki et al. |
| 4,923,932 A | 5/1990 | Katayose et al. |
| 5,001,010 A | 3/1991 | Chao et al. |
| 5,015,675 A | 5/1991 | Walles et al. |
| 5,021,543 A | 6/1991 | Mayska et al. |
| 5,064,882 A | 11/1991 | Walles et al. |
| 5,071,922 A | 12/1991 | Nelissen et al. |
| 5,079,268 A | 1/1992 | Nelissen et al. |
| 5,082,686 A | 1/1992 | Desorcie et al. |
| 5,091,480 A | 2/1992 | Percec |
| 5,162,433 A | 11/1992 | Nishio et al. |
| 5,213,886 A | 5/1993 | Chao et al. |

(Continued)

FOREIGN PATENT DOCUMENTS

EP  1 37 545 B1  7/1987

(Continued)

OTHER PUBLICATIONS

JP1997202850A; Aug. 5, 1997; "Epoxy Resin Composition for Sealing Use, Semiconductor Device Using the Same, and Production of the Composition"; Machine Translation (21 pages).

(Continued)

Primary Examiner—Sanza L. McClendon
(74) Attorney, Agent, or Firm—Cantor Colburn LLP

(57) ABSTRACT

A curable method useful for encapsulating solid state devices includes (A) an epoxy resin; (B) an effective amount of a cure catalyst comprising (B1) a first latent cationic cure catalyst comprising a diaryl iodonium hexafluoroantimonate salt; (B2) a second latent cationic cure catalyst comprising (B2a) a diaryl iodonium cation, and (B2b) an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and (B3) a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and (C) about 70 to about 95 weight percent of an inorganic filler, based on the total weight of the curable composition. The composition's cure catalyst allows the use of increased filler loadings, which in turn reduces moisture absorption and thermal expansion of the cured composition.

38 Claims, 1 Drawing Sheet

U.S. PATENT DOCUMENTS

| | | | |
|---|---|---|---|
| 5,290,883 A | 3/1994 | Hosokawa et al. | |
| 5,314,984 A | 5/1994 | Markovitz et al. | |
| 5,547,713 A * | 8/1996 | Alvarado | 427/493 |
| 5,610,443 A | 3/1997 | Inagaki et al. | |
| 5,618,891 A | 4/1997 | Markovitz | |
| 5,834,565 A | 11/1998 | Tracy et al. | |
| 5,863,970 A | 1/1999 | Ghoshal et al. | |
| 5,877,229 A * | 3/1999 | Janke et al. | 522/31 |
| 5,880,221 A | 3/1999 | Liska et al. | |
| 5,965,663 A | 10/1999 | Hayase | |
| 6,051,662 A | 4/2000 | Tracy et al. | |
| 6,096,821 A | 8/2000 | Adedeji et al. | |
| 6,197,898 B1 | 3/2001 | van den Berg et al. | |
| 6,204,304 B1 | 3/2001 | Houlihan et al. | |
| 6,232,362 B1 | 5/2001 | Agars et al. | |
| 6,235,807 B1 | 5/2001 | Misev | |
| 6,307,010 B1 | 10/2001 | Braat et al. | |
| 6,333,064 B1 | 12/2001 | Gan | |
| 6,352,782 B2 | 3/2002 | Yeager et al. | |
| 6,384,176 B1 | 5/2002 | Braat et al. | |
| 6,387,990 B1 | 5/2002 | Yeager | |
| 6,420,450 B1 | 7/2002 | Dengler et al. | |
| 6,437,090 B1 * | 8/2002 | Murai et al. | 528/416 |
| 6,469,124 B2 | 10/2002 | Braat et al. | |
| 6,498,200 B1 | 12/2002 | Suzuki et al. | |
| 6,518,362 B1 | 2/2003 | Clough et al. | |
| 6,569,982 B2 | 5/2003 | Hwang et al. | |
| 6,576,700 B2 | 6/2003 | Patel | |
| 6,576,718 B1 | 6/2003 | Yeager et al. | |
| 6,617,398 B2 | 9/2003 | Yeager et al. | |
| 6,617,400 B2 | 9/2003 | Yeager et al. | |
| 6,627,704 B2 | 9/2003 | Yeager et al. | |
| 6,627,708 B2 | 9/2003 | Braat et al. | |
| 6,632,892 B2 | 10/2003 | Rubinsztajn et al. | |
| 6,689,920 B2 | 2/2004 | Ishii et al. | |
| 6,770,460 B1 | 8/2004 | Palazzotto et al. | |
| 6,774,160 B2 | 8/2004 | Yeager | |
| 6,784,260 B2 | 8/2004 | Yeager et al. | |
| 6,787,605 B2 | 9/2004 | Clough et al. | |
| 6,787,633 B2 | 9/2004 | Peemans et al. | |
| 6,794,481 B2 | 9/2004 | Amagai et al. | |
| 6,800,373 B2 | 10/2004 | Gorczyca | |
| 6,812,276 B2 | 11/2004 | Yeager | |
| 6,835,785 B2 | 12/2004 | Ishii et al. | |
| 6,841,629 B1 | 1/2005 | Maeda et al. | |
| 6,878,632 B2 | 4/2005 | Nogami et al. | |
| 6,878,783 B2 | 4/2005 | Yeager et al. | |
| 6,897,282 B2 | 5/2005 | Freshour et al. | |
| 7,067,595 B2 | 6/2006 | Zarnoch et al. | |
| 2002/0077447 A1 | 6/2002 | Hwang et al. | |
| 2003/0018131 A1 | 1/2003 | Davis et al. | |
| 2003/0212230 A1 | 11/2003 | Rubinsztajn et al. | |
| 2003/0215588 A1 | 11/2003 | Yeager et al. | |
| 2004/0146692 A1 | 7/2004 | Inoue et al. | |
| 2004/0147715 A1 | 7/2004 | Ishii et al. | |
| 2004/0166241 A1 | 8/2004 | Gallo et al. | |
| 2004/0214004 A1 | 10/2004 | Amagai et al. | |
| 2004/0225082 A1 | 11/2004 | Mutsumi et al. | |
| 2004/0258852 A1 | 12/2004 | Ohno et al. | |
| 2004/0265595 A1 | 12/2004 | Tetsuji | |
| 2005/0004246 A1 | 1/2005 | Palazzotto et al. | |
| 2005/0070685 A1 | 3/2005 | Akira et al. | |
| 2005/0075462 A1 | 4/2005 | Zarnoch et al. | |
| 2005/0181214 A1 * | 8/2005 | Campbell et al. | 428/413 |
| 2006/0160982 A1 | 7/2006 | Ishii et al. | |
| 2007/0004871 A1 * | 1/2007 | Lu et al. | 525/396 |

FOREIGN PATENT DOCUMENTS

| | | |
|---|---|---|
| EP | 0 492 959 B1 | 7/1992 |
| EP | 0 261 574 B1 | 11/1992 |
| EP | 1630199 A1 | 3/2006 |
| WO | WO 03/072628 A1 | 9/2003 |

OTHER PUBLICATIONS

JP1997202851A; Aug. 5, 1997; "Epoxy Resin Composition for Sealing Use, Semiconductor Device Using the Same, and Production of the Composition"; Machine Translation (23 pages).

JP1998265553A; Oct. 6, 1998; "Epoxy Resin Composition for Sealing Material and Semiconductor Device"; Machine Translation (21 pages).

JP2003313290A; Nov. 6, 2003; "Process for Depositing Low-Molecular Weight Polyphenylene Ether"; Machine Translation (12 pages).

JP2003313291A; Nov. 6, 2003; "Process for Producing Expoxidized Polyphenylene Ether"; Machine Translation (17 pages).

JP2004115619A; Apr. 15, 2004; "Method for Producing Bifunctional Phenylene Ether"; Machine Translation (17 pages).

JP3525745B2; May 10, 2004; "Epoxy Resin Composition and Electric Insulating Substrate Made from the Same"; Machine Translation (15 pages).

JP3570146B2; Sep. 29, 2004; "Epoxy Resin Compositions and Adhesive Sheets and Heat-Resistant Laminates Therefrom"; Machine Translation (17 pages).

JP3570148B2; Sep. 29, 2004; "Epoxy Resin Compositions and Their Uses in Prepregs and Laminates"; Machine Translation (21 pages).

JP2004256717A; Sep. 16, 2004; "Oligomer-Modified Epoxy Resin, Its Composition, and Printed Wiring Board Using the Composition"; Machine Translation (38 pages).

JP2004307554A; Nov. 4, 2004; "Continuous Manufacture of Low-Molecular Weight Poly(Phenylene Ethers)"; Machine Translation (31 pages).

JP2004315725A; Nov. 11, 2004; "Fireproofing Polyphenylene Ether Resin Composition and Pregreg, Metallic Laminate, and Printed Circuit Board Prepared Thereby"; Machine Translation (15 pages).

JP2004331958A; Nov. 25, 2004; "Cured Products of Epoxy Resin Compositions Containing Epoxidized Poly(Phenylene Ethers) for Electronic Materials"; Machine Translation (22 pages).

JP2005023201A; Jan. 27, 2005; "Production Method of Bifunctional Phenylene Ether Oligomer"; Machine Translation (27 pages).

WO2004104097; Dec. 2, 2004; Abstract Only (1 page).

James V. Crivello, "The Synthesis and Cationic Polymerization of Novel Epoxide Monomers", Polymer Engineering and Science (1992), vol. 32, No. 20, pp. 1462-1465.

ASTM Designation D 3123-98 (Reapproved 2004); Standard Test Method for Spiral Flow of Low-Pressure Thermosetting Molding Compounds (3 pages).

JP2557748B2; Nov. 27, 1996; Machine Translation (37 pages).

JP1994271837A; Sep. 27, 1994; Machine Translation (12 pages).

JP2002187937A; Jul. 5, 2002; Machine Translation (25 pages).

International Search Report; International Application No. PCT/2006/023999; International Filing Date Jun. 21, 2006; Date of Mailing Dec. 18, 2006 (6 pages).

Venderbosch et al., "Processing of intractable polymers using reactive solvents: 2. Poly(2,6-dimethyl-1,4-phenylene ether) as a matrix material for high performance composites", Polymer, vol. 36, No. 6, pp. 1167-1178, 1995.

ASTM D790—03; "Standard Test Methods for Flexural Properties of Unreinforced and Reinforced Plastics and Electrical Insulating Materials"; 11 pages.

Prolongo, Siliva G., et al., "Poly(phenylene Ether)/Epoxy Thermoset Blends Based on Anionic Polymerization of Epoxy Monomer"; Journal of Applied Polymer Science; vol. 93, 2678-2687 (2004).

SEMI G 69 0996; "Test Method for Measurement of Adhesive Strength Between Leadframes and Molding Compounds"; 14 pages.

JP2005-023201A; Jan. 27, 2005; "Production Method of Bifunctional Phenylene Ether Oligomer"; Machine Translation.

* cited by examiner

MOLDING COMPOSITION AND METHOD, AND MOLDED ARTICLE

BACKGROUND OF THE INVENTION

Solid state electronic devices are typically encapsulated in plastic via transfer molding. Encapsulation protects the device from environmental and mechanical damage and electrically isolates the device. There are many desired technical features of encapsulant compositions. Encapsulation of wire-bonded devices requires low viscosity encapsulant injection, followed by rapid cure and hot ejection. In order to avoid damaging the solid state device, the encapsulant must not shrink excessively on curing. The encapsulated device must subsequently withstand the rigor of solder assembly onto a circuit card. The encapsulant must also be self-extinguishing in the event of a heat-producing malfunction of the circuit. And the encapsulant must adhere strongly to copper leadframes.

In current epoxy-based encapsulation compositions, it is advantageous to use as much mineral filler as possible in order to decrease moisture absorption and thermal expansion of the cured composition. However, higher filler levels are associated with reduced flow and impaired moldability, which are manifested as poor mold filling and increased defect generation. There is therefore a need for encapsulation compositions that exhibit increased flow at high filler loadings.

BRIEF DESCRIPTION OF THE INVENTION

The above-described and other drawbacks are alleviated by a curable composition, comprising:
an epoxy resin;
an effective amount of a cure catalyst comprising
    a first latent cationic cure catalyst comprising a diaryl iodonium hexafluoroantimonate salt; and
    a second latent cationic cure catalyst comprising
        a diaryl iodonium cation, and
        an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
    a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and
about 70 to about 95 weight percent of an inorganic filler, based on the total weight of the curable composition.

Other embodiments, including a cured composition, a method of preparing the curable composition, a method of encapsulating a solid state device, and an encapsulated solid state device, are described in detail below.

DETAILED DESCRIPTION OF THE INVENTION

Figure 1:
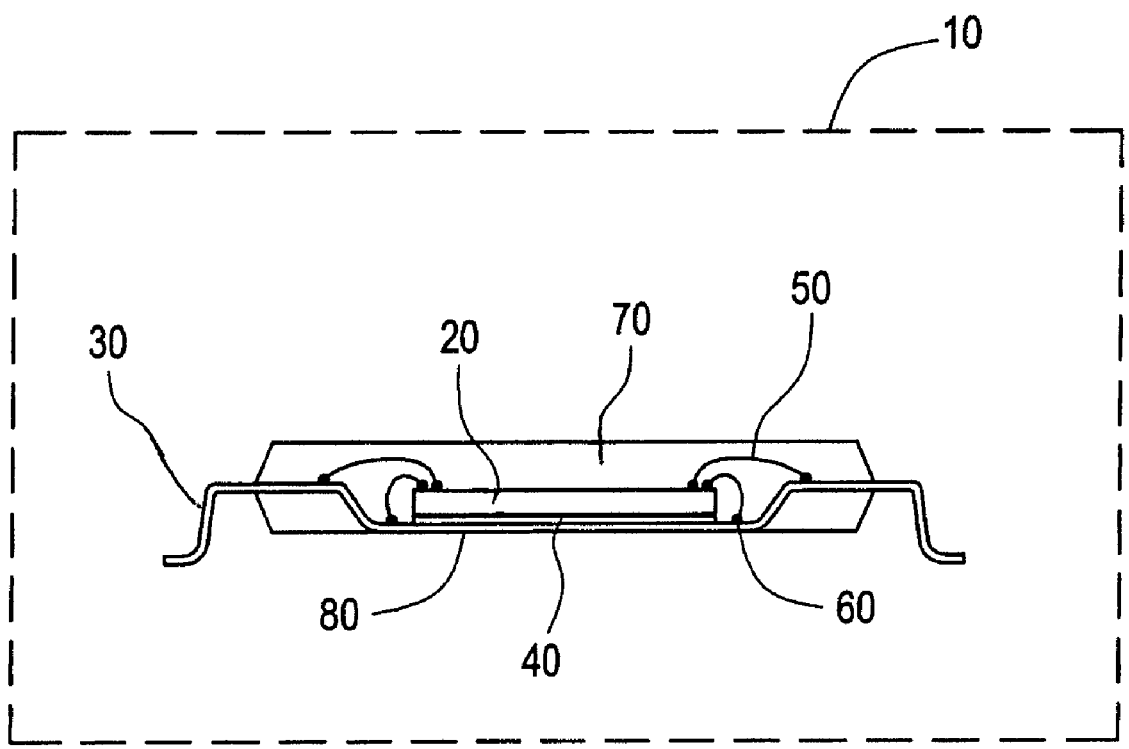
FIG. 1 is a side cross-sectional view of an encapsulated solid state device.

One embodiment is a curable composition, comprising:
an epoxy resin;
an effective amount of a cure catalyst comprising
    a first latent cationic cure catalyst comprising a diaryl iodonium hexafluoroantimonate salt; and
    a second latent cationic cure catalyst comprising
        a diaryl iodonium cation, and
        an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
    a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and
about 70 to about 95 weight percent of an inorganic filler, based on the total weight of the curable composition.

In the course of extensive research, the present inventors have discovered that these curable compositions, when compared to current epoxy-based encapsulation compositions, exhibit improved spiral flow at a given inorganic filler loading. This allows improved molding characteristics at constant filler loading, as well as equivalent molding characteristics at increased filler loading. The increased filler loadings translate into reduced moisture absorption and reduced thermal expansion in the cured compositions.

The curable composition comprises an epoxy resin. Suitable types of epoxy resins include, for example, aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and the like, and combinations thereof.

In one embodiment, a solid epoxy resin is used; i.e., the epoxy resin comprises an epoxy resin having a softening point of about 25° C. to about 150° C. Softening points may be determined according to ASTM E28-99 (2004). While it is possible to use epoxy resins with melting points below 25° C., the amounts of such resins should be low enough so as not to interfere with the desired friability of the curable composition as a whole.

In one embodiment, the epoxy resin comprises a monomeric epoxy resin (e.g., 3,3',5,5'-tetramethyl-4,4'-diglycidyloxybiphenyl, available as RSS1407LC from Yuka Shell), and an oligomeric epoxy resin (e.g., an epoxidized cresol novolac resin, or a multi aromatic resin such as Nippon Kayaku's NC3000). Monomeric epoxy resins are typically crystalline solids, whereas oligomeric epoxy resins are typically glasses.

In one embodiment, the epoxy resin comprises a biphenyl epoxy resin and an epoxidized ortho-cresol novolac resin.

The amount of epoxy resin in the composition will vary according to the specific use of the composition and the types and amounts of other components, but it will typically be about 4 to about 30 weight percent, based on the total weight of the composition. Within this range, the epoxy amount may be at least about 6 weight percent, or at least about 8 weight percent. Also within this range, the epoxy amount may be up to about 20 weight percent, or up to about 15 weight percent.

The curable composition comprises a cure catalyst comprising a first latent cationic cure catalyst, a second latent cationic cure catalyst, and a cure co-catalyst. The first latent cationic cure catalyst comprises a diaryl iodonium hexafluoroantimonate salt. In one embodiment, the diaryl iodonium hexafluoroantimonate salt comprises a diaryl iodonium cation having the structure

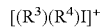

wherein $R^3$ and $R^4$ are each independently $C_6$-$C_{14}$ hydrocarbyl, optionally substituted with from 1 to 4 monovalent radicals selected from $C_1$-$C_{20}$ alkyl, $C_1$-$C_{20}$ alkoxy, nitro, and chloro. As used herein, the term "hydrocarbyl", whether used by itself, or as a prefix, suffix, or fragment of another term, refers to a residue that contains only carbon and hydrogen. The residue may be aliphatic or aromatic, straight-chain, cyclic, bicyclic, branched, saturated, or unsaturated. It may also contain combinations of aliphatic, aromatic, straight chain, cyclic, bicyclic, branched, saturated, and unsaturated hydrocarbon moieties. The hydrocarbyl residue, when so stated however, may contain heteroatoms over and above the carbon and hydrogen members of the substituent residue. Thus, when specifically noted as containing such heteroatoms, the hydrocarbyl or hydrocarbylene residue may also contain carbonyl groups, amino groups, hydroxyl groups, or the like, or it may contain heteroatoms within the backbone of the hydrocarbyl residue.

In one embodiment, the diaryl iodonium hexafluoroantimonate salt comprises a diaryl iodonium cation having the structure

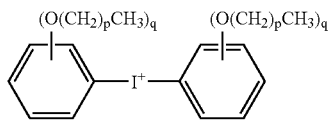

wherein each occurrence of p is independently 0 to 19, and each occurrence of q is independently 0, 1, or 2, with the proviso that at least one occurrence of q is at least 1.

In one embodiment, the diaryl iodonium hexafluoroantimonate salt comprises 4-octyloxyphenyl phenyl iodonium hexafluoroantimonate.

The cure catalyst comprises a second latent cationic cure catalyst, which in turn comprises a diaryl iodonium cation, and an anion selected from perchlorate, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, imidodisulfurylfluoride anion (—N($SO_2F)_2$), tris(trifluoromethylsulfonyl)methyl anion (—C($SO_2CF_3)_3$), bis(trifluoromethylsulfonyl)methyl anion (—CH($SO_2CF_3)_2$), bis(trifluoromethylsulfuryl)imide anion (—N($SO_2CF_3)_2$), and the like, and combinations thereof.

Suitable unsubstituted and substituted ($C_1$-$C_{12}$)-hydrocarbylsulfonates include, for example, alkylsulfonates, such as methanesulfonate, butanesulfonate, octanesulfonate, camphorsulfonate, 7,7-dimethyl-2-oxobicyclo[2.2.1]heptane-1-methanesulfonate, and the like; perfluoroalkylsulfonates, such as trifluoromethylsulfonate (triflate), and nonafluorobutanesulfonate (nonaflate), perfluorooctanesulfonate, and the like; arylsulfonates such as 4-fluorobenzenesulfonate, 4-methylbenzenesulfonate (tosylate), 9,10-dimethoxyanthracene-2-sulfonate, and the like; and combinations thereof.

Suitable ($C_2$-$C_{12}$)-perfluoroalkanoates include, for example, trifluoroacetate, nonafluoropentanoate, and the like; and combinations thereof.

Suitable unsubstituted and substituted tetra-($C_1$-$C_{12}$)-hydrocarbylborates include, for example, tetraarylborates such as tetraphenylborate, tetrakis[2,3,5,6-tetrafluoro-4-(trifluoromethyl)phenyl]borate, tetrakis(3,5-dichloro-2,4,6-trifluorophenyl)borate, tetrakis[3,5-bis(trifluoromethyl)phenyl]borate, tetrakis(pentafluorophenyl)borate, and the like; and alkylarylborates such as tris(3-fluorophenyl)hexylborate, butyltriphenylborate, and the like; and combinations thereof.

In one embodiment, the diaryl iodonium cation of the second latent cationic cure catalyst comprises a diaryl iodonium cation having the structure

wherein $R^3$ and $R^4$ are each independently $C_6$-$C_{14}$ hydrocarbyl, optionally substituted with from 1 to 4 monovalent radicals selected from $C_1$-$C_{20}$ alkyl, $C_1$-$C_{20}$ alkoxy, nitro, and chloro.

In one embodiment, the diaryl iodonium cation of the second latent cationic cure catalyst comprises a diaryl iodonium cation having the structure

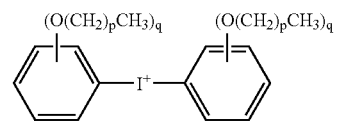

wherein each occurrence of p is independently 0 to 19, and each occurrence of q is independently 0, 1, or 2, with the proviso that at least one occurrence of q is at least 1.

In one embodiment, the diaryl iodonium cation of the second latent cationic cure catalyst comprises 4-octyloxyphenyl phenyl iodonium cation. In one embodiment, the anion $X^-$ is selected from trifluoromethylsulfonate, nonafluorobutanesulfonate, and hexafluorophosphate.

The cure catalyst comprises a cure co-catalyst selected from free-radical generating aromatic compounds, peroxy compounds, copper (II) salts of aliphatic carboxylic acids, copper (II) salts of aromatic carboxylic acids, copper (II) acetylacetonate, and the like, and combinations thereof. In one embodiment, the cure co-catalyst comprises benzopinacole.

In one embodiment, the diaryl iodonium hexafluoroantimonate salt comprises 4-octyloxyphenyl phenyl iodonium hexafluoroantimonate; and the second latent cationic cure catalyst comprises 4-octyloxyphenyl phenyl iodonium cation and an anion $X^-$ selected from perchlorate, imidodisulfurylfluoride anion, trifluoromethylsulfonate, perfluorobutanesulfonate, perfluorooctanesulfonate, 4-fluorobenzenesulfonate, 4-methylbenzenesulfonate, tetrafluoroborate, tetraphenylborate, tetrakis[2,3,5,6-tetrafluoro-4-(trifluoromethyl)phenyl]borate, tetrakis(3,5-dichloro-2,4,6-trifluorophenyl)borate, tetrakis[3,5-bis(trifluoromethyl)phenyl]borate, tetrakis(pentafluorophenyl)borate, tris(3-fluorophenyl)hexylborate, butyltriphenylborate, hexafluorophosphate, hexafluoroarsenate, and the like.

In one embodiment, the first latent cationic cure catalyst comprises 4-octyloxyphenyl phenyl iodonium hexafluoroantimonate; the second latent cationic cure catalyst comprises 4-octyloxyphenyl phenyl iodonium cation and an anion selected from trifluoromethylsulfonate, nonafluorobutanesulfonate, and hexafluorophosphate; and the cure co-catalyst comprises benzopinacole.

In one embodiment, the first latent cationic cure catalyst and the second latent cationic cure catalyst are both photochemically active in contrast to the cure catalyst mixtures described in U.S. Pat. No. 6,777,460 B2 to Palazzotto et al, which comprise a photochemically active salt and a non-photochemically active salt.

The components of the cure catalyst are present in amounts such that the cure catalyst as a whole is effective to cure the epoxy resin. Specific amounts of the cure catalyst components will vary depend on the types and amounts of composition components, but they are generally present in the following amounts. The first latent cure catalyst is generally present at about 0.2 to about 5 parts by weight per 100 parts by weight of the epoxy resin. Within the range, the first latent cure catalyst amount may be at least about 0.3 parts by weight, or at least 0.7 parts by weight. Also within this range, the first latent cure catalyst amount may be up to about 3 parts by weight, or up to about 2 parts by weight.

The second latent cure catalyst is generally present at about 0.1 to about 3 parts by weight per 100 parts by weight of the epoxy resin. Within this range, the second latent cure catalyst amount may be at least about 0.2 parts by weight, or at least about 0.4 parts by weight. Also within this range, the second latent cure catalyst amount may be up to about 2 parts by weight, or up to about 1 part by weight The cure co-catalyst is generally present at about 0.2 to about 5 parts by weight per 100 parts by weight of epoxy resin. Within this range, the cure co-catalyst amount may be at least about 0.3 parts by weight, or at least about 0.7 parts by weight. Also within this range, the cure co-catalyst amount may be up to about 3 parts by weight, or up to about 2 parts by weight.

The curable composition comprises about 70 to about 95 weight percent of an inorganic filler, based on the total weight of the curable composition. In one embodiment, the inorganic filler is selected from metal oxides, metal nitrides, metal carbonates, metal hydroxides, and combinations thereof. In one embodiment, the inorganic filler may be alumina, silica (including fused silica and crystalline silica), boron nitride (including spherical boron nitride), aluminum nitride, silicon nitride, magnesia, magnesium silicate, and the like, and combinations thereof. In one embodiment, the inorganic filler comprises a fused silica. In one embodiment, the inorganic filler comprises, based on the total weight of inorganic filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer.

The composition may, optionally, further comprise a poly(arylene ether) resin. In one embodiment, wherein the poly(arylene ether) resin comprises a plurality of repeating units having the structure

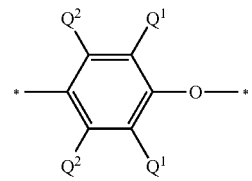

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms. Methods of preparing poly(arylene ether) resins are known in the art and include, for example, U.S. Pat. Nos. 3,306,874 and 3,306,875 to Hay.

In one embodiment, the poly(arylene ether) resin has the structure

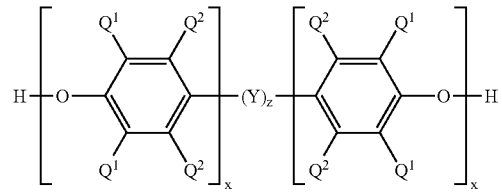

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; each occurrence of x is independently 1 to about 100; z is 0 or 1; and Y has a structure selected from

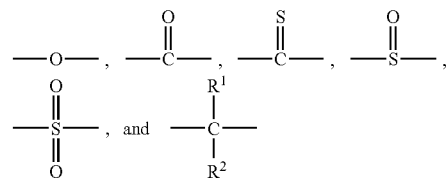

wherein each occurrence of $R^1$ and $R^2$ is independently selected from hydrogen and $C_1$-$C_{12}$ hydrocarbyl. Methods for producing these poly(arylene ether) resins, sometimes called "dihydroxy" or "difunctional" or "bifunctional" poly (arylene ether) resins are described, for example, in U.S. Pat. No. 3,496,236 to Cooper et al., U.S. Pat. Nos. 4,140,675 and 4,165,422 and 4,234,706 to White, U.S. Pat. Nos. 4,521,584 and 4,677,185 to Heitz et al., U.S. Pat. Nos. 4,562,243 and 4,663,402 and 4,665,137 to Percec, U.S. Pat. No. 5,021,543 to Mayska et al., U.S. Pat. No. 5,880,221 to Liska et al., U.S. Pat. No. 5,965,663 to Hayase, U.S. Pat. No. 6,307,010 B1 to Braat et al., U.S. Pat. No. 6,569,982 to Hwang et al., and U.S. Pat. No. 6,794,481 to Amagai et al.

In one embodiment, the poly(arylene ether) resin comprises at least one terminal functional group selected from carboxylic acid, glycidyl ether, and anhydride. Poly(arylene ether) resins substituted with terminal carboxylic acid groups and methods for their preparation are described, for example, in European Patent No. 261,574 B1 to Peters et al. Glycidyl ether-functionalized poly(arylene ether) resins and methods for their preparation are described, for example, in U.S. Pat. No. 6,794,481 to Amagai et al. and U.S. Pat. No. 6,835,785 to Ishii et al., and U.S. Patent Application Publication No. 2004/0265595 A1 to Tokiwa. Anhydride-functionalized poly(arylene ether) resins and methods for their preparation are described, for example, in European Patent No. 261,574 B1 to Peters et al., and U.S. Patent Application Publication No. 2004/0258852 A1 to Ohno et al.

In one embodiment, the poly(arylene ether) has an intrinsic viscosity of about 0.03 to about 1.0 deciliter per gram measured at 25° C. in chloroform. In one embodiment, the poly(arylene ether) resin has an intrinsic viscosity of about 0.03 to 0.15 deciliter per gram measured at 25° C. in chloroform.

In one embodiment, the poly(arylene ether) resin comprises less than 5 weight percent of particles having an equivalent spherical diameter greater than 100 micrometers. The poly(arylene ether) resin may comprise less than 2 weight percent, or less than 1 weight percent of such particles. The poly(arylene ether) resin may exclude particles greater than 80 micrometers, or greater than 60 micrometers. Methods of preparing such poly(arylene ether)s directly or via comminution and size segregation are known in the art. For example, a poly(arylene ether) resin meeting the particle size limitation may be prepared directly by controlling precipitation conditions as described, for example, in U.S. Pat. No. 6,787,633 B2 to Peemans et al. As another example, a poly(arylene ether) resin meeting the particle size limitation may be prepared by starting with a poly(arylene ether) having greater than 5 weight percent of particles greater than 100 micrometers, reducing the particle size, e.g., by grinding, and separating a poly(arylene ether) resin fraction meeting the particle size limitation, e.g., by sieving the resin with a 170 mesh (88 micrometer opening) sieve.

When present, the poly(arylene ether) resin may be used in an amount of about 2 to about 50 parts by weight of poly(arylene ether) resin per 100 parts by weight of the epoxy resin. Within this range, the poly(arylene ether) resin amount may be at least about 5 parts by weight, or at least about 10 parts by weight. Also within this range, the poly(arylene ether) amount may be up to about 40 parts by weight, or up to about 30 parts by weight.

The curable composition may, optionally, further comprise a low stress additive to reduce stresses imposed on the solid state device during the curing that follows encapsulation. Suitable low stress additives include, for example, polybutadienes, hydrogenated polybutadienes, polyisoprenes, hydrogenated polyisoprenes, butadiene-styrene copolymers, hydrogenated butadiene-styrene copolymers, butadiene-acrylonitrile copolymers, hydrogenated butadiene-acrylonitrile copolymers, polydimethylsiloxanes, poly (dimethysiloxane-co-diphenylsiloxane)s, and combinations thereof; wherein the low stress additive comprises at least one functional group selected from hydroxy, carboxylic acid, anhydride, and glycidyl. Suitable low stress additives thus include, for example, hydroxy-terminated polybutadienes, carboxy-terminated polybutadienes, maleic anhydride-functionalized ("maleinized") polybutadienes, epoxy-terminated polybutadienes, hydroxy-terminated hydrogenated polybutadienes, carboxy-terminated hydrogenated polybutadienes, maleic anhydride-functionalized hydrogenated polybutadienes, epoxy-terminated hydrogenated polybutadienes, hydroxy-terminated styrene-butadiene copolymers (including, random, block, and graft copolymers), carboxy-terminated styrene-butadiene copolymers (including, random, block, and graft copolymers), maleic anhydride functionalized styrene-butadiene copolymers (including, random, block, and graft copolymers), epoxy-terminated styrene-butadiene copolymers (including, random, block, and graft copolymers), butadiene-acrylonitrile copolymers, hydrogenated butadiene-acrylonitrile copolymers, hydroxy-terminated (i.e., silanol-terminated) polydimethylsiloxanes, hydrocarbyloxy-terminated (i.e., carbinol-terminated) polydimethylsiloxanes, carboxy-terminated polydimethylsiloxanes, anhydride-terminated polydimethylsiloxanes, epoxy-terminated polydimethylsiloxanes, hydroxy-terminated poly(dimethysiloxane-co-diphenylsiloxane)s, carboxy-terminated poly (dimethysiloxane-co-diphenylsiloxane)s, anhydride-terminated poly(dimethysiloxane-co-diphenylsiloxane)s, epoxy-terminated poly(dimethysiloxane-co-diphenylsiloxane)s, and the like, and combinations thereof. These rubbery modifiers and methods for their preparation are known in the art, and many are commercially available. A suitable amount of rubbery modifier will depend on the type and amount of epoxy resin and the filler loading, among other factors, but it is generally about 1 to about 30 parts by weight per 100 parts by weight of the epoxy resin. Rubbery modifiers may be in the form of finely dispersed particles or reactive liquids.

As mentioned above, the curable composition comprises an effective amount of a curing co-catalyst selected from free-radical generating aromatic compounds, peroxy compounds, capper (II) salts of aliphatic carboxylic acids, copper (II) salts of aromatic carboxylic acids, copper (II) acetylacetonate, and combinations thereof.

Suitable curing co-catalysts include, for example, free-radical generating aromatic compounds (e.g., benzopinacole), copper (II) salts of aliphatic earboxylic acids (e.g., copper (II) stearate), copper (II) salts of aromatic carboxylic acids (e.g., copper (II) benzoate, copper (II) naphthenate, and copper (II) salicylate), copper (II) acetylacetonate, peroxy compounds (e.g., t-butyl peroxybenzoate, 2,5-bis-t-butylperoxy-2,5-dimethyl-3-hexyne, and other peroxy compounds as described, for example, in U.S. Pat. No. 6,627,704 to Yeager et al.), and the like, and combinations thereof. In one embodiment, the curing co-catalyst comprises benzopinacole. In another embodiment, the curing co-catalyst comprises copper (II) acetylacetonate. A suitable amount of curing co-catalyst will depend on the type of co-catalyst, the type and amount of epoxy resin, and the type and amount of cure catalyst, among other factors, but it in generally about 0.01 to about 20 parts by weight per 100 parts by weight of epoxy resin.

The curable composition may, optionally, further comprise one or more additives known in the art. Such additives include, for example, phenolic hardeners, anhydride hardeners, silane coupling agents, flame retardants, mold release agents, colorants (including pigments and dyes), thermal stabilizers, adhesion promoters, and combinations thereof. Those skilled in the art can select suitable additives and amounts. When phenolic hardeners and/or anhydride hardeners are present, they are used in an amount such that the primary curing mechanism is epoxy homopolymerization induced by the cure catalyst.

In one embodiment, the composition is substantially free of polystyrene polymers, including high impact polystyrenes. Such polystyrene polymers may be defined, for example, by reference to U.S. Pat. No. 6,518,362 to Clough et al.

In one embodiment, the curable composition comprises
an epoxy resin comprising a biphenyl epoxy resin and an epoxidized ortho-cresol novolac resin;
an effective amount of a cure catalyst comprising
a first latent cationic cure catalyst comprising 4-octyloxyphenyl phenyl iodonium hexafluoroantimonate;
a second latent cationic cure catalyst comprising 4-octyloxyphenyl phenyl iodonium cation and an anion selected from trifluoromethylsulfonate, nonafluorobutanesulfonate, and hexafluorophosphate; and
a cure co-catalyst comprising benzopinacole; and
about 70 to about 95 weight percent of a silica filler, based on the total weight of silica filler; wherein the silica filler comprises about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer.

In this embodiment, the composition may, optionally, further comprise about 2 to about 50 parts by weight of a poly(arylene ether) resin per 100 parts by weight of the epoxy resin.

As the composition is defined as comprising multiple components, it will be understood that each component is chemically distinct, particularly in the instance that a single chemical compound may satisfy the definition of more than one component.

The invention includes cured compositions obtained on curing the curable compositions described herein. Thus, one embodiment is a cured composition comprising the reaction product of a curable composition comprising:
an epoxy resin;
an effective amount of a cure catalyst comprising
a first latent cationic cure catalyst comprising a diaryl iodonium hexafluoroantimonate salt; and
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and
about 70 to about 95 weight percent of an inorganic filler, based on the total weight of the curable composition.

The invention includes methods of preparing the curable composition. Thus, one embodiment is a method of preparing a curable composition, comprising
blending
epoxy resin;
an effective amount of a cure catalyst comprising
a first latent cationic cure catalyst comprising a diaryl iodonium hexafluoroantimonate salt;
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
a cure co-catalyst selected from free-radical generating aromatic compounds, peroxy compounds, copper (II) salts of aliphatic carboxylic acids, copper (II) salts of aromatic carboxylic acids, copper (ft) acetylacetonate, and combinations thereof; and
about 70 to about 95 weight percent of an inorganic filler, based on the total weight of the curable composition;

to form an intimate blend.

Another method of preparing a curable composition, comprises:
dry blending
an epoxy resin;
an effective amount of a cure catalyst comprising
a first latent cationic cure catalyst comprising a diaryl iodonium hexafluoroantimonate salt;
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof, and
a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and about 70 to about 95 weight percent of an inorganic filler, based on the total weight of the curable composition;
to form a first blend;
melt mixing the first blend at a temperature of about 90 to about 115° C. to form a second blend;
cooling the second blend; and
grinding the cooled second blend to form the curable composition.

The invention includes methods of encapsulating solid state devices using the curable composition. Thus, one embodiment is a method of encapsulating a solid state device, comprising:
encapsulating a solid state device with a curable composition comprising
an epoxy resin;
effective amount of a cure catalyst comprising
a first latent cationic cure catalyst comprising a diaryl iodonium hexafluoroantimonate salt;
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
a cure co-catalyst selected from free-radical generating aromatic compounds, peroxy compounds, copper (It) salts of aliphatic carboxylic acids, copper (II) salts of aromatic carboxylic acids, copper (II) acetylacetonate, and combinations thereof; and
about 70 to about 95 weight percent of an inorganic filler, based on the total weight of the curable composition; and
curing the curable composition. Curing the composition may, optionally, include a post-curing step (e.g., at about 150 to about 190° C. for about 0.5 to about 8 hours in a convection oven).

Suitable methods for encapsulating solid state devices are known in the art and described, for example, in U.S. Pat. No. 5,064,882 to Walles, U.S. Pat. No. 6,632,892 B2 to Rubinsztajn et al., U.S. Pat. No. 6,800,373 B2 to Gorczyca, U.S. Pat. No. 6,878,783 to Yeager et al.; U.S. Patent Application Publication No. 2004/0166241 A1 to Gallo et al.; and International Patent Application No. WO 03/072628 A1 to Ikezawa et al.

The invention further includes encapsulated solid state devices prepared using the curable composition. Thus, one embodiment is an encapsulated solid state device, comprising:
a solid state device; and
a cured composition encapsulating the solid state device, wherein the cured composition comprises the reaction product obtained on curing a curable composition comprising
epoxy resin;
an effective amount of a cure catalyst comprising
a first latent cationic cure catalyst comprising a diaryl iodonium hexafluoroantimonate salt;
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
a cure co-catalyst selected from free-radical generating aromatic compounds, peroxy compounds, copper (II) salts of aliphatic carboxylic acids, copper (II) salts of
aromatic carboxylic acids, copper (II) acetylacetonate, and combinations thereof; and
about 70 to about 95 weight percent of an inorganic filler, based on the total weight of the curable composition.

FIG. 1 is a side cross-sectional view of an encapsulated solid state device, 10. The solid state device 20 is attached to copper leadframe 30 via adhesive layer 40. The solid state device 10 is electrically connected to the copper leadframe 30 via gold wires 50 and ground bonds 60. Cured molding compound 70 encapsulates the solid state device 20, any exposed edges of the adhesive layer 40, gold wires 50, ground bonds 60, and a portion of the copper lead frame 30, leaving exposed the pad 80, corresponding to a surface of the copper leadframe 30 beneath the solid state device 20.

All ranges disclosed herein are inclusive of the endpoints, and the endpoints are combinable with each other.

The invention is further illustrated by the following non-limiting examples.

GENERAL DESCRIPTION OF EXPERIMENTAL METHODS

Compounds were prepared by mixing the ingredients first in a Henschel mixer, and then passing them through a twin-screw extruder set at 60° C. in the rear section and 90° C. in the front. After cooling and hardening, the materials were then ground to a powder using a Retch mill.

Spiral flow lengths were determined according to ASTM standard D3123-98 (also SEMI G11-88), using the standard spiral flow mold specified therein. A 20-gram charge of the molding compound was transferred into the spiral cavity of the tool, and the length traveled by the compound before flow stopped due to curing and pressure drop was measured. The injection speed and injection pressure were kept constant across all formulations, at 5.84 centimeters/second (2.3 inches/sec) and 6.9 megapascals (MPa), respectively.

Specimens for flexural strength, thermomechanical analysis, and moisture absorption measurements were prepared by transfer molding as follows. A 15-ton resin transfer press (Fujiwa) was used. A 4-cavity "lzod" specimen mold was used to transfer-mold a 35-gram charge of EMC under an injection pressure of 6.9 MPa, at a ram speed of 0.254 millimeters/second (0.1 inches/second). The mold was maintained at 175° C., and a two minute cure cycle was used. Specimens were post-cured in a forced-air convection oven for six hours at 175° C.

Thermomechanical analysis (TMA) was used to determine the coefficient of thermal expansion (CTE) values and the glass transition temperature ($T_g$) of the molded EMC. TMA was performed on a Perkin Elmer TMA 7 Instrument. Transfer-molded specimens measuring at least 3 millimeters in each dimension were used. The sample temperature was first ramped at 5° C./min from 25° C. to 250° C. then cooled at 5° C./min to 0° C. The second heat, used for analysis, ramped from 0° C. at 5° C./min to 250° C. An initial vertical probe force of 0.05 Newton was used. The glass transition temperature, $T_g$, was taken as the point of intersection of two tangents drawn to the dimension-temperature curve, at 50° C. and 190° C. The measurements were made under a nitrogen atmosphere at 100 milliliters/minute.

Moisture absorption was determined by measuring the increase in weight of 6.35 cm×1.25 cm×0.3 cm (2.5 inch× 0.5 inch×⅛ inch; standard "Izod"dimensions) samples after 24 hours in boiling water.

Flexural Strength was determined at room temperature according to ASTM D790 for three-point bend flexural test using 6.35 cm×1.27 cm×0.3175 cm (2.5 inch×0.5 inch×⅛ inch) samples.

EXAMPLES 1-4

The compositions detailed in Table 1 were mixed as described above. Examples 1-3 are comparative examples. All component amounts in Table 1 are expressed in parts by weight. Example 4 is an example of the present invention. "Denka FB570 silica" is a fused silica obtained from Denka having a median particle size of 17.7 micrometers and a surface area of 3.1 meter²/gram. "Denka SFP silica" is a fused silica obtained from Denka having a median particle size of 0.7 micrometers and a surface area of 6.2 meter²/gram. "Yuka RSS1407LC epoxy", obtained from Yuka Shell, is 3,3',5,5'-tetramethyl-4,4'-diglycidyloxybiphenyl. "Sumitomo ECN-195XL-25", obtained from Sumitomo Chemical, is an epoxidized ortho-cresol novolac resin. "OPPI" is 4-octyloxyphenyl phenyl iodonium hexafluoroantimonate available from GE Advanced Materials-Silicones as UV9392c. "OPPI O3SC4F9" is 4-octyloxyphenyl phenyl iodonium nonafluoro-n-butane sulfonate. It was prepared as follows: 50 grams of 4-octyloxyphenyl phenyl iodonium toluenesulfonate (from GE Silicones) was stirred with 30 grams of potassium nonafluoro-n-butanesulfonate in 250 milliliters acetone for 2 hours at room temperature; next the mixture was filtered to remove the potassium toluenesulfonate that had precipitated out of solution; after ⅔ of the acetone was removed under vacuum, the solution was poured into 1000 milliliters deionized water; this caused the product to precipitate as an orangish solid; after drying over night in a vacuum oven at 50° C., 57.8 grams of product (95% yield) was obtained; further purification was achieved by recrystallization from 40 milliliters toluene plus 160 milliliters hexane; the resulting material was a white solid with a melting point of 97-98° C. A micronized carnauba wax was obtained as MICHEM® Wax 411 from Michelman. Carbon black pigment was obtained as BLACK PEARLS® 120 from Cabot.

TABLE 1

| Ingredient | Example 1 | Example 2 | Example 3 | Example 4 |
| --- | --- | --- | --- | --- |
| Denka FB570 Silica | 1530 | 1530 | 1530 | 1530 |
| Denka SFP Silica | 170 | 170 | 170 | 170 |
| Yuka RSS1407LC Epoxy | 56.97 | 56.86 | 56.59 | 56.59 |
| Sumitomo ECN-195XL-25 | 227.89 | 227.45 | 226.34 | 226.34 |
| OPPI | 3.42 | 2.84 | 4.24 | 2.83 |
| OPPI O3SC4F9 | 0 | 0 | 0 | 1.41 |
| Benzopinacole | 1.71 | 2.84 | 2.83 | 2.83 |
| Carnauba Wax | 6.0 | 6.0 | 6.0 | 6.0 |
| Carbon Black | 4.0 | 4.0 | 4.0 | 4.0 |

Measured property values are presented in Table 2, below. The results show that the use Example 4, with a mixture of iodonium hexafluoroantimonate and iodonium perfluorobutane sulfonate salts, exhibited substantially increased spiral flow relative to Examples 1-3 with varying levels of the iodonium hexafluoroantimonate alone. Other properties remained relatively constant.

TABLE 2

| Test | Example 1 | Example 2 | Example 3 | Example 4 |
| --- | --- | --- | --- | --- |
| Spiral Flow (cm) at 175° C. | 78.5 | 74.9 | 76.5 | 128.0 |
| Spiral Flow (cm) at 165° C. | 104.9 | 93.2 | 101.0 | 152.9 |
| CTE1 (ppm/° C.) | 11 | 12 | 12 | 11 |
| CTE2 (ppm/° C.) | 39 | 47 | 39 | 41 |
| $T_g$ (° C.) | 148 | 138 | 154 | 154 |
| Moisture Abs. (%) | 0.238 | 0.238 | 0.266 | 0.236 |
| Flex Strength (MPa) | 129.5 | 146.1 | 136.5 | 131.5 |

EXAMPLES 5 AND 6

The materials listed in Table 3 were mixed as described above to produce curable compositions. Example 5 is a comparative example while Example 6 is an example of the use of the present invention.

TABLE 3

| Ingredient | Example 5 | Example 6 |
| --- | --- | --- |
| Denka FB570 Silica | 1575 | 1429.02 |
| Denka SFP Silica | 175 | 158.78 |
| Nippon Kayaku NC-3000 Epoxy Resin | 235.3 | 212.44 |
| OPPI | 2.35 | 2.12 |
| OPPI O3SC4F9 | 0 | 1.06 |
| Benzopinacole | 2.35 | 2.12 |
| Carnauba Wax | 6.0 | 5.44 |
| Carbon Black | 4.0 | 3.63 |

Measured property values are presented in Table 4, below. These data once again demonstrate that increased spiral flows can be achieved with the mixed catalysts.

TABLE 4

| Test | Example 5 | Example 6 |
| --- | --- | --- |
| Spiral Flow (cm) at 175° C. | 70.6 | 91.4 |
| Spiral Flow (cm) at 165° C. | 94.7 | 112.5 |
| CTE1 (ppm/° C.) | 10 | 8.7 |
| CTE2 (ppm/° C.) | 39 | 34 |
| $T_g$ (° C.) | 141 | 148 |
| Moisture Abs. (%) | 0.166 | 0.209 |
| Flex Strength (MPa) | 130.8 | 127.7 |

EXAMPLES 7 AND 8

The materials listed in Table 5 were mixed as described above to give curable compositions. Example 7 is a comparative example at 90% filler loading while Example 8 is an example of the use of the present invention at the same filler loading.

TABLE 5

| Ingredient | Example 7 | Example 8 |
| --- | --- | --- |
| Denka FB570 Silica | 1620 | 1620 |
| Denka SFP Silica | 180 | 180 |

TABLE 5-continued

| Ingredient | Example 7 | Example 8 |
| --- | --- | --- |
| Yuka RSS1407LC Epoxy | 37.33 | 37.07 |
| Sumitomo ECN-195XL-25 | 149.31 | 148.3 |
| OPPI | 2.24 | 1.85 |
| OPPI O3SC4F9 | 0 | 0.93 |
| Benzopinacole | 1.12 | 1.85 |
| Carnauba Wax | 6.0 | 6.0 |
| Carbon Black | 4.0 | 4.0 |

Measured property values are presented in Table 6, below. Comparing spiral flow values for Example 7, with a single iodonium catalyst, and Example 8, with an iodonium catalyst mixture, shows that use of the iodonium catalyst mixture enhances spiral flow even at very high filler content.

TABLE 6

| Test | Example 7 | Example 8 |
| --- | --- | --- |
| Spiral Flow (cm) at 175° C. | 41.4 | 71.4 |
| Spiral Flow (cm) at 165° C. | 53.8 | 85.1 |
| CTE1 (ppm/° C.) | 7 | 6.1 |
| CTE2 (ppm/° C.) | 25 | 28 |
| $T_g$ (° C.) | 143 | 152 |
| Moisture Abs. (%) | 0.178 | 0.209 |
| Flex Strength (MPa) | 130.4 | 131.4 |

EXAMPLES 9 AND 10

Molding compounds containing 4-octyloxyphenyl phenyl iodonium hexafluoroantimonate ("OPPI $SbF_6^-$") and either 4-octyloxyphenyl phenyl iodonium triflate ("OPPI $CF_3SO_3^-$") or 4-octyloxyphenyl phenyl iodonium hexafluorophosphate ("OPPI $PF_6^-$") were prepared and tested as described above. Samples of 4-octyloxyphenyl phenyl iodonium triflate and 4-octyloxyphenyl phenyl iodonium hexafluorophosphate were obtained from Hampford Research.

TABLE 7

| Ingredient | Example 7 | Example 8 |
| --- | --- | --- |
| Denka FB570 Silica | 1530 | 1530 |
| Denka SFP Silica | 170 | 170 |
| Yuka RSS1407LC Epoxy | 56.59 | 56.59 |
| Sumitomo ECN-195XL-25 | 226.34 | 226.34 |
| OPPI $SbF_6^-$ | 2.83 | 2.83 |
| OPPI $CF_3SO_3^-$ | 1.41 | 0 |
| OPPI $PF_6^-$ | 0 | 1.41 |
| Benzopinacole | 2.83 | 2.83 |
| Carnauba Wax | 6.00 | 6.00 |
| Carbon Black | 4.00 | 4.00 |

Measured property values are presented in Table 8, below. Compared to Example 3 above, Examples 9 and 10 exhibited significantly enhanced spiral flow.

TABLE 8

| Property | Example 9 | Example 10 |
| --- | --- | --- |
| Spiral Flow (in) at 175° C. | 49.4 | 49.0 |
| Spiral Flow (in) at 165° C. | Not Tested | 58.0 |
| Moisture Abs. (%) | 0.187 | 0.226 |
| Flex Strength (MPa) | 139.6 | 117.1 |
| Cu Tab Pull Adhesion (lbs) | 11.3 | 26.3 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A curable composition, comprising:
   an epoxy resin;
   an effective amount of a cure catalyst comprising
      a first latent cationic cure catalyst comprising a diaryl iodonium hexafluoroantimonate salt; and
      a second latent cationic cure catalyst comprising
         a diaryl iodonium cation, and
         an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and
      a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and
   about 70 to about 95 weight percent of an inorganic filler, based on the total weight of the curable composition.

2. The curable composition of claim 1, wherein the epoxy resin comprises an epoxy resin having a softening point of about 25° C. to about 150° C.

3. The curable composition of claim 1, wherein the epoxy resin is selected from aliphatic epoxy resins, cycloaliphatic epoxy resins, bisphenol-A epoxy resins, bisphenol-F epoxy resins, phenol novolac epoxy resins, cresol-novolac epoxy resins, biphenyl epoxy resins, polyfunctional epoxy resins, naphthalene epoxy resins, divinylbenzene dioxide, 2-glycidylphenylglycidyl ether, dicyclopentadiene-type epoxy resins, multi aromatic resin type epoxy resins, and combinations thereof.

4. The curable composition of claim 1, wherein the epoxy resin comprises a monomeric epoxy resin and an oligomeric epoxy resin.

5. The curable composition of claim 1, wherein the epoxy resin comprises a biphenyl epoxy resin and an epoxidized ortho-cresol novolac resin.

6. The curable composition of claim 1, wherein the diaryl iodonium hexafluoroantimonate salt comprises a diaryl iodonium cation having the structure

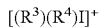

wherein $R^3$ and $R^4$ are each independently $C_6$-$C_{14}$ hydrocarbyl, optionally substituted with from 1 to 4 monovalent radicals selected from $C_1$-$C_{20}$ alkyl, $C_1$-$C_{20}$ alkoxy, nitro, and chloro.

7. The curable composition of claim 1, wherein the diaryl iodonium hexafluoroantimonate salt comprises a diaryl iodonium cation having the structure

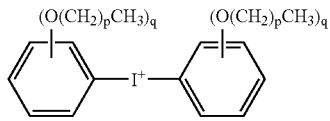

wherein each occurrence of p is independently 0 to 19, and each occurrence of q is independently 0, 1, or 2, with the proviso that at least one occurrence of q is at least 1.

8. The curable composition of claim 1, wherein the diaryl iodonium hexafluoroantimonate salt comprises 4-octyloxyphenyl phenyl iodonium hexafluoroantimonate.

9. The curable composition of claim 1, wherein the diaryl iodonium cation of the second latent cationic cure catalyst comprises a diaryl iodonium cation having the structure

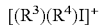

wherein $R^3$ and $R^4$ are each independently $C_6$-$C_{14}$ hydrocarbyl, optionally substituted with from 1 to 4 monovalent radicals selected from $C_1$-$C_{20}$ alkyl, $C_1$-$C_{20}$ alkoxy, nitro, and chloro.

10. The curable composition of claim 1, wherein the diaryl iodonium cation of the second latent cationic cure catalyst comprises a diaryl iodonium cation having the structure

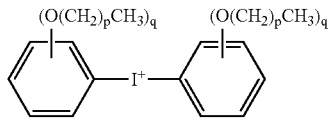

wherein each occurrence of p is independently 0 to 19, and each occurrence of q is independently 0, 1, or 2, with the proviso that at least one occurrence of q is at least 1.

11. The curable composition of claim 1, wherein the diaryl iodonium cation of the second latent cationic cure catalyst comprises 4-octyloxyphenyl phenyl iodonium cation.

12. The curable composition of claim 1, wherein the anion of the second latent cationic cure catalyst is selected from trifluoromethylsulfonate, nonafluorobutanesulfonate, and hexafluorophosphate.

13. The curable composition of claim 1, wherein the diaryl iodonium hexafluoroantimonate salt comprises 4-octyloxyphenyl phenyl iodonium hexafluoroantimonate; and wherein the second latent cationic cure catalyst comprises 4-octyloxyphenyl phenyl iodonium cation and an anion selected from perchlorate, imidodisulfurylfluoride anion, trifluoromethylsulfonate, perfluorobutanesulfonate, perfluorooctanesulfonate, 4-fluorobenzenesulfonate, 4-methylbenzenesulfonate, tetrafluoroborate, tetraphenylborate, tetrakis[2,3,5,6-tetrafluoro-4-(trifluoromethyl)phenyl]borate, tetrakis(3,5-dichloro-2,4,6-trifluorophenyl)borate, tetrakis[3,5-bis(trifluoromethyl)phenyl]borate, tetrakis(pentafluorophenyl)borate, tris(3-fluorophenyl)hexylborate, butyltriphenylborate, hexafluorophosphate, and hexafluoroarsenate.

14. The curable composition of claim 1, wherein the cure co-catalyst comprises benzopinacole.

15. The curable composition of claim 1, wherein the first latent cationic cure catalyst comprises 4-octyloxyphenyl phenyl iodonium hexafluoroantimonate; wherein the second latent cationic cure catalyst comprises 4-octyloxyphenyl phenyl iodonium cation and an anion selected from trifluoromethylsulfonate, nonafluorobutanesulfonate, and hexafluorophosphate; and wherein the cure co-catalyst comprises benzopinacole.

16. The curable composition of claim 1, wherein the first latent cationic cure catalyst and the second latent cationic cure catalyst are photochemically active.

17. The curable composition of claim 1, comprising about 0.2 to about 5 parts by weight of the first latent cationic cure catalyst, about 0.1 to about 3 parts by weight of the second latent cationic cure catalyst, and about 0.2 to about 5 parts by weight of the cure co-catalyst, all based on 100 parts by weight of the epoxy resin.

18. The curable composition of claim 1, wherein the inorganic filler is selected from metal oxides, metal nitrides, metal carbonates, metal hydroxides, and combinations thereof.

19. The curable composition of claim 1, wherein the inorganic filler is selected from alumina, silica, boron nitride, aluminum nitride, silicon nitride, magnesia, magnesium silicate, and combinations thereof.

20. The curable composition of claim 1, wherein the inorganic filler comprises a fused silica.

21. The curable composition of claim 1, wherein the inorganic filler comprises, based on the total weight of inorganic filler, about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer.

22. The curable composition of claim 1, further comprising a poly(arylene ether) resin.

23. The curable composition of claim 22, wherein the poly(arylene ether) resin comprises a plurality of repeating units having the structure

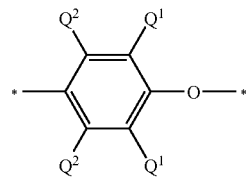

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms.

24. The curable composition of claim 22, wherein the poly(arylene ether) resin has the structure

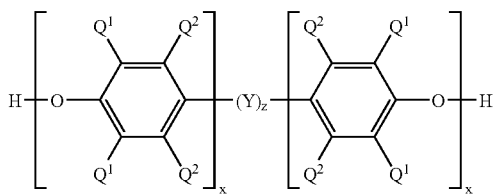

wherein each occurrence of $Q^2$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; and wherein each occurrence of $Q^1$ is independently selected from hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ hydroxyalkyl, phenyl, $C_1$-$C_{12}$ haloalkyl, $C_1$-$C_{12}$ hydrocarbyloxy, and $C_2$-$C_{12}$ halohydrocarbyloxy wherein at least two carbon atoms separate the halogen and oxygen atoms; each occurrence of x is independently 1 to about 100; z is 0 or 1; and Y has a structure selected from

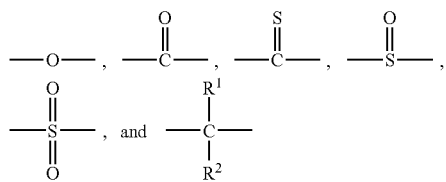

wherein each occurrence of $R^1$ and $R^2$ is independently selected from hydrogen and $C_1$-$C_{12}$ hydrocarbyl.

25. The curable composition of claim 22, wherein the poly(arylene ether) resin comprises at least one terminal functional group selected from carboxylic acid, glycidyl ether, and anhydride.

26. The curable composition of claim 22, wherein the poly(arylene ether) has an intrinsic viscosity of about 0.03 to about 1.0 deciliter per gram measured at 25° C. in chloroform.

27. The curable composition of claim 22, wherein the poly(arylene ether) resin has an intrinsic viscosity of about 0.03 to 0.15 deciliter per gram measured at 25° C. in chloroform.

28. The curable composition of claim 22, wherein the poly(arylene ether) resin comprises less than 5 weight percent of particles greater than 100 micrometers.

29. The curable composition of claim 1, further comprising a low stress additive selected from polybutadienes, hydrogenated polybutadienes, polyisoprenes, hydrogenated polyisoprenes, butadiene-styrene copolymers, hydrogenated butadiene-styrene copolymers, butadiene-acrylonitrile copolymers, hydrogenated butadiene-acrylonitrile copolymers, polydimethysiloxanes, poly(dimethysiloxane-co-diphenylsiloxane)s, and combinations thereof; wherein the low stress additive comprises at least one functional group selected from hydroxy, hydrocarbyloxy, vinyl ether, carboxylic acid, anhydride, and glycidyl.

30. The curable composition of claim 1, further comprising an additive selected from phenolic hardeners, anhydride hardeners, silane coupling agents, flame retardants, mold release agents, colorants, thermal stabilizers, adhesion promoters, and combinations thereof.

31. The curable composition of claim 1, wherein the composition is substantially free of polystyrene polymers.

32. A curable composition, comprising:
an epoxy resin comprising a biphenyl epoxy resin and an epoxidized ortho-cresol novolac resin;
an effective amount of a cure catalyst comprising
a first latent cationic cure catalyst comprising 4-octyloxyphenyl phenyl iodonium hexafluoroantimonate;
a second latent cationic cure catalyst comprising 4-octyloxyphenyl phenyl iodonium cation and an anion selected from trifluoromethylsulfonate, nonafluorobutanesulfonate, and hexafluorophosphate; and
a cure co-catalyst comprising benzopinacole; and
about 70 to about 95 weight percent of a silica filler, based on the total weight of silica filler; wherein the silica filler comprises about 75 to about 98 weight percent of a first fused silica having an average particle size of 1 micrometer to about 30 micrometers, and about 2 to about 25 weight percent of a second fused silica having an average particle size of about 0.03 micrometer to less than 1 micrometer.

33. The curable composition of claim 32, further comprising about 2 to about 50 parts by weight of a poly(arylene ether) resin per 100 parts by weight of the epoxy resin.

34. A cured composition comprising the reaction product of a curable composition comprising:
an epoxy resin;
an effective amount of a cure catalyst comprising
a first latent cationic cure catalyst comprising a diaryl iodonium hexafluoroantimonate salt; and
a second latent cationic cure catalyst comprising
a diaryl jodonium cation, and
an anion selected from perchiorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion and combinations thereof; and
a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and
about 70 to about 95 weight percent of an inorganic filler, based on the total weight of the curable composition.

35. A method of preparing a curable composition, comprising
blending
an epoxy resin;
an effective amount of a cure catalyst comprising
a first latent cationic cure catalyst comprising a diaryl iodonium hexafluoroantimonate salt;
a second latent cationic cure catalyst comprising
a diaryl iodonium cation, and
an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and about 70 to about 95 weight percent of an inorganic filler, based on the total weight of the curable composition;

to form an intimate blend.

36. A method of preparing a curable composition, comprising:

dry blending an epoxy resin;

an effective amount of a cure catalyst comprising a first latent cationic cure catalyst comprising a diaryl iodonium hexafluoroantimonate salt;

a second latent cationic cure catalyst comprising a diaryl iodonium cation, and an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and about 70 to about 95 weight percent of an inorganic filler, based on the total weight of the curable composition;

to form a first blend;

melt mixing the first blend at a temperature of about 90 to about 115° C. to form a second blend;

cooling the second blend; and grinding the cooled second blend to form the curable composition.

37. A method of encapsulating a solid state device, comprising:

encapsulating a solid state device with a curable composition comprising an epoxy resin;

an effective amount of a cure catalyst comprising a first latent cationic cure catalyst comprising a diaryl iodonium hexafluoroantimonate salt;

a second latent cationic cure catalyst comprising a diaryl iodonium cation, and an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and about 70 to about 95 weight percent of an inorganic filler, based on the total weight of the curable composition; and curing the curable composition.

38. An encapsulated solid state device, comprising:

a solid state device; and a cured composition encapsulating the solid state device, wherein the cured composition comprises the products obtained on curing a curable composition comprising an epoxy resin;

an effective amount of a cure catalyst comprising a first latent cationic cure catalyst comprising a diaryl iodonium hexafluoroantimonate salt;

a second latent cationic cure catalyst comprising a diaryl iodonium cation, and an anion selected from perchlorate, imidodisulfurylfluoride anion, unsubstituted and substituted ($C_1$-$C_{12}$)-hydrocarbylsulfonates, ($C_2$-$C_{12}$)-perfluoroalkanoates, tetrafluoroborate, unsubstituted and substituted tetra-($C_1$-$C_{12}$)-hydrocarbylborates, hexafluorophosphate, hexafluoroarsenate, tris(trifluoromethylsulfonyl)methyl anion, bis(trifluoromethylsulfonyl)methyl anion, bis(trifluoromethylsulfuryl)imide anion, and combinations thereof; and a cure co-catalyst selected from free-radical generating aromatic compounds, peroxy compounds, copper (II) salts of aliphatic carboxylic acids, copper (II) salts of aromatic carboxylic acids, copper (II) acetylacetonate, and combinations thereof; and about 70 to about 95 weight percent of an inorganic filler, based on the total weight of the curable composition.

* * * * *